(12) United States Patent
Kwon et al.

(10) Patent No.: US 12,062,884 B2
(45) Date of Patent: Aug. 13, 2024

(54) LASER DEVICE

(71) Applicant: Electronics and Telecommunications Research Institute, Daejeon (KR)

(72) Inventors: Oh Kee Kwon, Sejong-si (KR); Kisoo Kim, Seoul (KR); Su Hwan Oh, Daejeon (KR); Chul-Wook Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 686 days.

(21) Appl. No.: 17/182,976

(22) Filed: Feb. 23, 2021

(65) Prior Publication Data

US 2021/0288463 A1    Sep. 16, 2021

(30) Foreign Application Priority Data

Mar. 13, 2020    (KR) .................. 10-2020-0031380

(51) Int. Cl.
*H01S 5/0625*    (2006.01)
*H01S 5/026*    (2006.01)
(Continued)

(52) U.S. Cl.
CPC .......... *H01S 5/06256* (2013.01); *H01S 5/026* (2013.01); *H01S 5/04256* (2019.08);
(Continued)

(58) Field of Classification Search
CPC .. H01S 5/06256; H01S 5/026; H01S 5/04256; H01S 5/0625; H01S 5/068;
(Continued)

(56) References Cited

U.S. PATENT DOCUMENTS 6,606,335 B1    8/2003  Kuramata et al.
8,149,890 B2    4/2012  Park et al.
(Continued)

FOREIGN PATENT DOCUMENTS

JP    H0697604 A  *  4/1994  ......... H01S 5/06256
JP    9-83087        3/1997
(Continued)

OTHER PUBLICATIONS

Machine translation of JPH06-97604A (Year: 1994).*
(Continued)

*Primary Examiner* — Yuanda Zhang
(74) *Attorney, Agent, or Firm* — KILE PARK REED & HOUTTEMAN PLLC

(57) ABSTRACT

Provided is a laser device according to embodiments of the inventive concept comprising a substrate including a gain region, a phase control region, and a tuning region arranged along a first direction, the substrate having an air gap which extends from the phase control region to the tuning region, an upper clad layer on the substrate, a waveguide structure extending in the first direction between the upper clad layer and the substrate, a first upper electrode disposed on the upper surface of the upper clad layer of the tuning region, and a lower electrode disposed on a lower surface of the substrate and extending from the gain region to the tuning region, wherein the air gap may have a larger width than the waveguide in a second direction crossing the first direction.

14 Claims, 7 Drawing Sheets

(51) Int. Cl.
*H01S 5/042* (2006.01)
*H01S 5/068* (2006.01)
*H01S 5/183* (2006.01)
*H01S 5/227* (2006.01)
*H01S 5/10* (2021.01)

(52) U.S. Cl.
CPC ............ *H01S 5/0625* (2013.01); *H01S 5/068* (2013.01); *H01S 5/227* (2013.01); *H01S 5/06258* (2013.01); *H01S 5/1007* (2013.01); *H01S 5/18363* (2013.01)

(58) Field of Classification Search
CPC .... H01S 5/227; H01S 5/06258; H01S 5/1007; H01S 5/18363
See application file for complete search history.

(56) References Cited

U.S. PATENT DOCUMENTS

| | | | |
|---|---|---|---|
| 10,148,067 | B2 | 12/2018 | Kwon et al. |
| 10,277,008 | B1 * | 4/2019 | An .......................... H01S 5/062 |
| 10,476,232 | B2 | 11/2019 | Kwon et al. |
| 2002/0181532 | A1 | 12/2002 | Ryu et al. |
| 2003/0147617 | A1 | 8/2003 | Park et al. |
| 2018/0205199 | A1 * | 7/2018 | Kwon ................. H01S 5/02461 |
| 2018/0205200 | A1 * | 7/2018 | Kwon ...................... G02B 6/12 |
| 2019/0369328 | A1 * | 12/2019 | Davies ................... H01S 5/026 |

FOREIGN PATENT DOCUMENTS

| | | |
|---|---|---|
| KR | 10-2001-0052808 | 6/2001 |
| KR | 2002-0091635 | 12/2002 |
| KR | 2003-0067142 | 8/2003 |
| KR | 10-2018-0084002 | 7/2018 |
| KR | 10-2018-0085861 | 7/2018 |
| KR | 10-2019-0074148 | 6/2019 |

OTHER PUBLICATIONS

Oh-Kee Kwon et al., "Proposal of novel structure for wide wavelength tuning in distributed Bragg reflector laser diode with single grating mirror", Optics Express, Oct. 29, 2018, pp. 28704-28712, vol. 26, No. 22.

Su Hwan Oh et al., "1.3-μm and 10-Gbps tunable DBR-LD for low-cost application of WDM-based mobile front haul networks", Optics Express, Sep. 30, 2019, pp. 29241-29247, vol. 27, No. 20.

* cited by examiner

LASER DEVICE

CROSS-REFERENCE TO RELATED APPLICATIONS

This U.S. non-provisional patent application claims priority under 35 U.S.C. § 119 of Korean Patent Application No. 10-2020-0031380, filed on Mar. 13, 2020, the entire contents of which are hereby incorporated by reference.

BACKGROUND

The present disclosure herein relates to a laser device, and more particularly, to a laser device that may be modulated in a differential mode.

The modulated wavelength-tunable light source is a light source capable of performing both wavelength-tunable and modulating functions at the same time, and is commonly used in a wavelength division multiplexing (WDM) system. In recent years, the modulated wavelength-tunable light source is being used instead of a fixed wavelength light source of a mobile front-haul network, and is also utilized as a channel switch of the next generation-passive optical network 2 (NG-PON2).

The modulated wavelength-tunable light source may be implemented in various forms, and among them, a distributed Bragg reflector-laser diode (DBR-LD) is highly competitive in terms of device size, manufacturing cost, and operation stability.

SUMMARY

The present disclosure provides a laser device that may be modulated in a differential mode and has an excellent signal-to-noise ratio.

Embodiments of the inventive concept provide a laser device including: a substrate including a gain region, a phase control region, and a tuning region arranged along a first direction, the substrate having an air gap which extends from the phase control region to the tuning region; an upper clad layer on the substrate; a waveguide structure extending in the first direction between the upper clad layer and the substrate; a first upper electrode disposed on the upper surface of the upper clad layer of the tuning region; and a lower electrode disposed on the lower surface of the substrate and extending from the gain region to the tuning region, wherein the air gap may have a larger width than the waveguide in a second direction crossing the first direction.

In embodiments, the laser device may further include grating patterns in the substrate of the tuning region, the grating patterns disposed between the air gap and the upper surface of the substrate.

In embodiments, the substrate may include a support layer and a lower clad layer disposed on the support layer, the lower clad layer has a width in the second direction smaller than that of the support layer, and the air gap may be located at a lower level than the lower clad layer.

In embodiments, the width of the air gap in the second direction may be greater than that of the lower clad layer in the second direction.

In embodiments, the air gap may have a width smaller than the maximum width of the substrate in the second direction.

In embodiments, the laser device may further include: a second upper electrode on the upper clad layer of the phase control region; a third upper electrode on the upper clad layer of the tuning region; and an upper insulating layer between the second and third upper electrodes and the upper cladding layer.

In embodiments, the laser device may further include a second upper electrode on the upper clad layer of the phase control region and a plurality of pads connected to the second upper electrode.

In embodiments, the waveguide structure may further include: an active waveguide on the gain region; and a passive waveguide connected to the active waveguide and on the phase control region and the tuning region.

In embodiments, the laser device may further include side semiconductor patterns disposed on a side surface of the waveguide structure.

In embodiments, the upper clad layer may have a conductivity type which is different from that of the substrate.

In embodiments of the inventive concept, laser devices include: a substrate including a gain region, a tuning region, and a phase control region between the gain region and the tuning region, the substrate having an air gap which extends from the phase control region to the tuning region; a lower electrode disposed on the lower surface of the substrate and extending from the gain region to the tuning region; an upper clad layer on the upper surface of the substrate; a waveguide structure between the substrate and the upper cladding layer; a first upper electrode disposed on the upper cladding layer of the gain region and electrically connected to the upper cladding layer; a second upper electrode disposed on the upper clad layer of the phase control region and electrically insulated from the upper clad layer; and a third upper electrode disposed on the upper clad layer of the tuning region and electrically insulated from the upper clad layer.

In embodiments, the lower electrode may be electrically connected to the gain region, the phase control region, and the tuning region of the substrate.

In embodiments, the upper clad layer may have a conductivity type which is different from that of the substrate.

In embodiments, the laser device may further include a first pad on the first upper electrode and an insulating pillar between the first pad and the substrate, wherein the insulating pillar may have a lower permittivity than the substrate.

In embodiments, the substrate may include a support layer and a lower clad layer having a width in the second direction, which is smaller than that of the support layer, wherein the air gap may be located at a lower level than the lower clad layer.

In embodiments, the laser device may further include second pads on the second upper electrode and third pads on the third upper electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
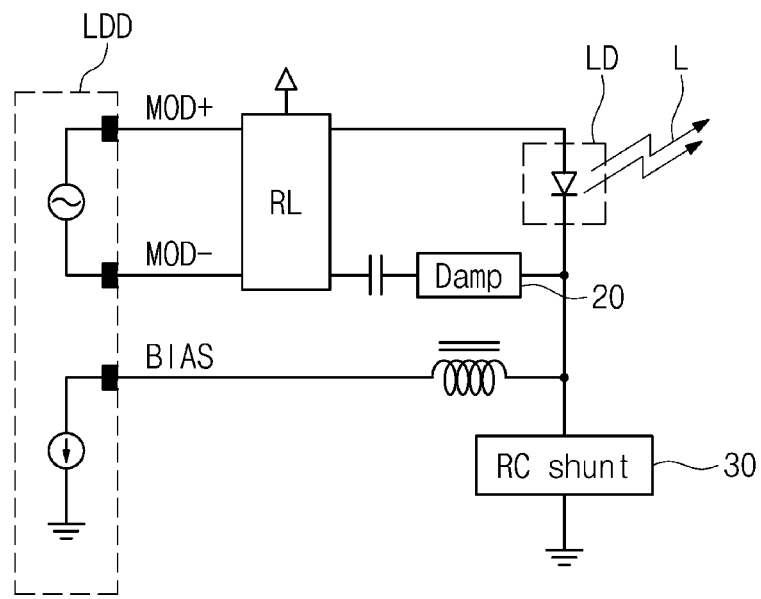
FIG. 1 is a circuit diagram illustrating a laser device according to embodiments of the inventive concept.

For the full understanding of the configuration and effects of the present invention, preferred embodiments of the present invention will be described with reference to the accompanying drawings. However, the present invention is not limited to the embodiments disclosed below, but may be implemented in various forms and various changes may be added thereto. The descriptions of the embodiments are just provided to complete the disclosure of the present invention and to fully inform the scope of the present invention to those of ordinary skill in the art to which the present invention belongs. Those of ordinary skill in the art will understand in which environment the concepts of the present invention may be suitably practiced.

The terminology used herein is for the purpose of describing embodiments and is not intended to be limiting of the invention. In this specification, the singular forms are intended to include the plural forms as well, unless the context clearly indicates otherwise. As used in this specification, the terms "comprises" and/or "comprising" specify the presence of stated components, steps, operations and/or elements, but do not preclude the presence or addition of one or more other components, steps, operations, and/or elements.

In this specification, when a film (or layer) is referred to as being on another film (or layer) or on a substrate, it can be directly on the other film (or layer) or on the substrate, or a third film (or layer) may be present therebetween.

Although the terms first, second, etc. are used in various embodiments of this specification to describe various regions, films (or layers) and the like, these regions and films should not be limited by these terms. These terms are only used to distinguish one region or film (or layer) from another region or film (or layer). Each embodiment described and illustrated herein also includes the complementary embodiment thereof. Throughout the specification, parts indicated by same reference numerals refer to same components.

Unless otherwise defined, the terms used in the embodiments of the present invention may be interpreted as meanings commonly known to those of ordinary skill in the art.

Hereinafter, the laser device according to embodiments of the inventive concept will be explained in detail with reference to the accompanying drawings.

FIG. 1 is a circuit diagram illustrating a laser device according to embodiments of the inventive concept.

Referring to FIG. 1, the laser device according to embodiments of the inventive concept may include a laser diode LD and a laser diode driver LDD which provides a driving signal to the laser diode LD.

The laser diode LD may be connected to modulation ports MOD+ and MOD− of the laser diode driver LDD, and a closed circuit may be disposed together with the laser diode driver LDD. The laser diode may receive the driving signal from the laser diode driver LDD and output a laser beam L.

The laser diode driver LDD may be connected to cathode and anode electrodes of the laser diode LD. The output terminals of the laser diode driver LDD are not connected to an auxiliary driver for optical modulation, but may be directly connected to the cathode and anode electrodes of the laser diode LD. The laser diode driver LDD may include a voltage source. The voltage source may be an alternating current voltage source, and implemented as a differential amplifier. The laser diode driver LDD may provide an alternating current to the laser diode LD through a BIAS port BIAS, and the laser diode driver LDD may provide a modulated current to the laser diode LD through the modulation ports MOD+ and MOD−.

An RL circuit RL for alternating current (AC) and direct current (DC) coupling may be connected between the laser diode LD and the laser diode driver LDD. The RL circuit RL may include, for example, a pull-up inductor and a resistance. The pull-up inductor may include, for example, a ferrite bead.

A damp 20 and a capacitor may be disposed in a closed circuit in which the laser diode LD and the laser diode driver LDD are located. The damp 20 may include, for example, a damping resistor, and improve Impedance matching, reflected wave damping, and load stability. The capacitor may perform AC coupling between the modulation port MOD+ and the cathode of the laser diode LD.

An RC shunt circuit 30 may be connected to the laser diode LD and the laser diode driver LDD. The RC shunt circuit 30 may be configured to keep load impedance constant. The RC shunt circuit 30 may offset parasitic effects caused by a bonding wire or a lead wire in the packaging process of the laser diode LD. According to embodiments of the inventive concept, the RC shunt circuit 30 may be omitted.

Figure 2:
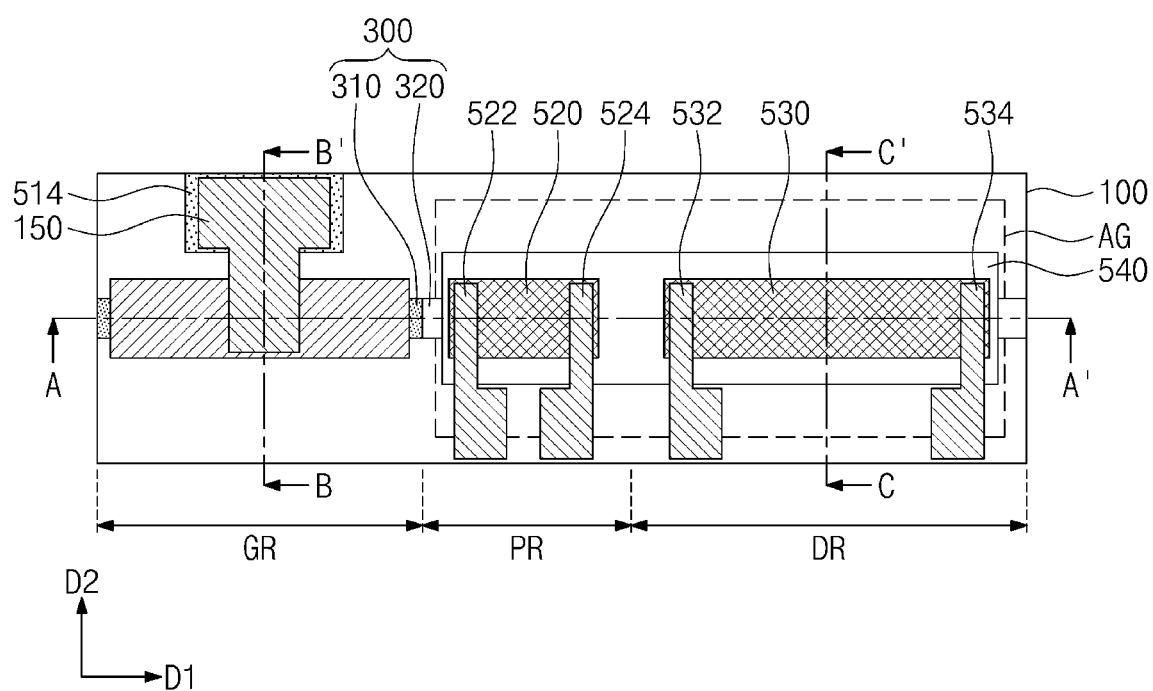
FIG. 2 is a plan view of a laser device according to embodiments of the inventive concept.
Figure 3A:
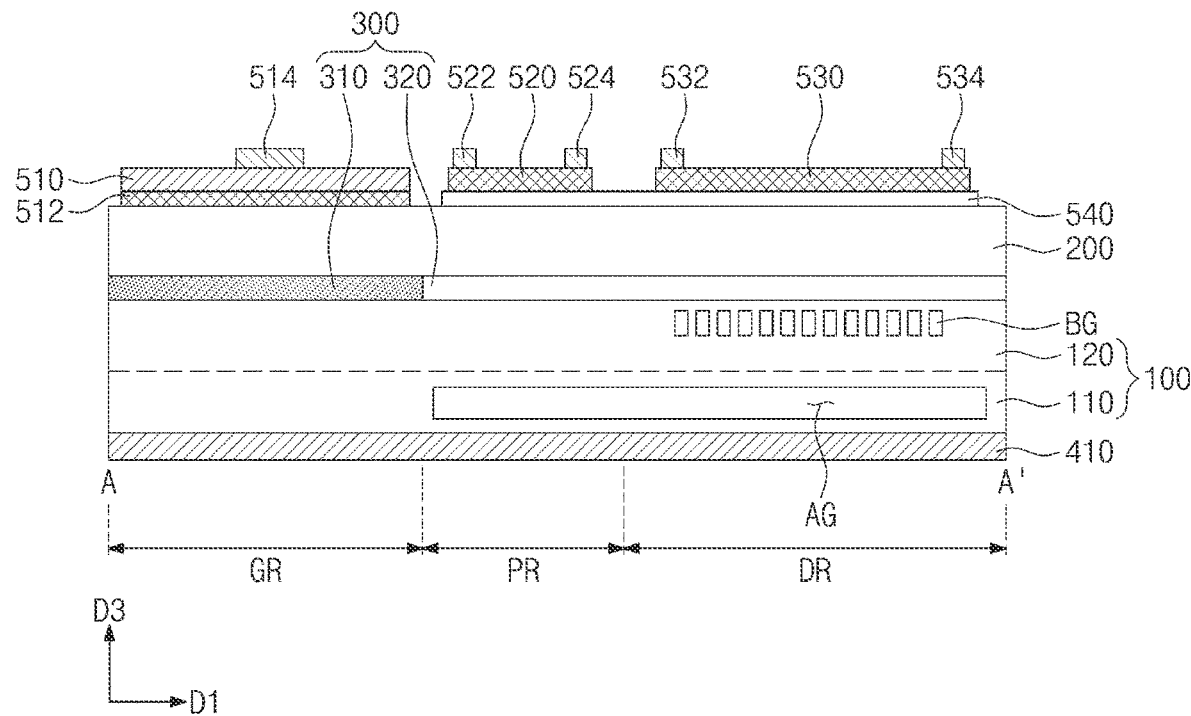
FIGS. 3A, 3B, and 3C are cross-sectional views, which are taken along lines A-A', B-B', and C-C' of FIG. 2, to illustrate a laser device according to embodiments of the inventive concept.
Figure 3B:
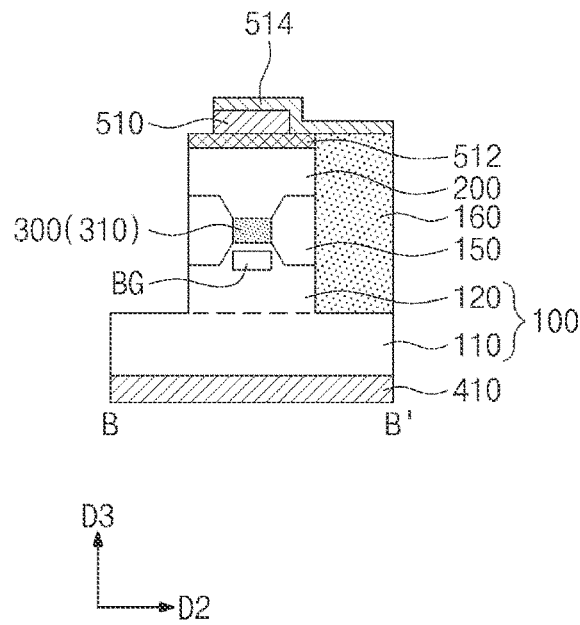
Figure 3C:
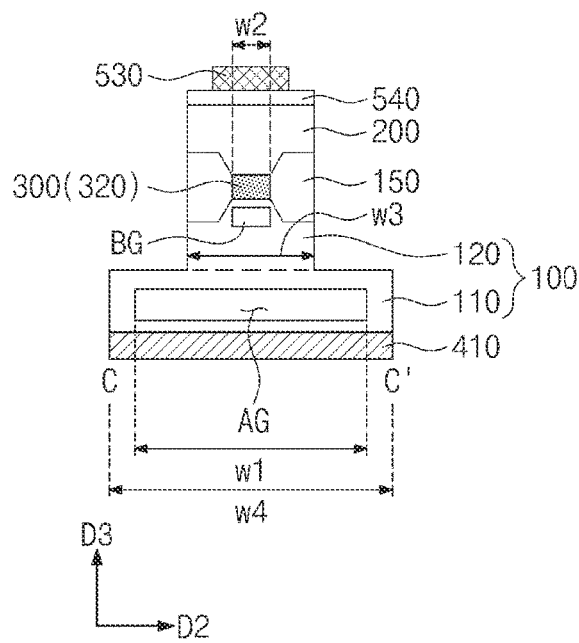

FIG. 2 is a plan view of a laser device according to embodiments of the inventive concept. FIGS. 3A, 3B, and 3C are cross-sectional views, which are taken along lines A-A', B-B', and C-C' of FIG. 2, to illustrate a laser device according to embodiments of the inventive concept.

Referring to FIGS. 2, 3A, 3B, and 3C, the laser device according to embodiments of the inventive concept may include a substrate 100, an upper clad layer 200, a waveguide structure 300, a lower electrode 410, and upper electrodes 510, 520, and 530.

The substrate 100 may include a gain region GR, a phase control region PR, and a tuning region DR. The substrate 100 may extend in a first direction D1, and the gain region GR, the phase control region PR, and the tuning region DR may be sequentially arranged along the first direction D1. The gain region GR and the tuning region DR may be spaced apart from each other in the first direction D1, and the phase control region PR may be disposed between the gain region GR and the tuning region DR. The substrate 100 may include a compound semiconductor. The substrate 100 may contain, for example, indium phosphide (InP). The substrate 100 may have a single-layer structure or a multilayer structure. The substrate 100 may include, for example, an indium phosphide substrate and an indium phosphide Indium epitaxial layer disposed on the indium phosphide substrate. The substrate 100 may be doped with a dopant of a first conductivity type. The first conductivity type may be, for example, an n-type.

The waveguide structure 300 may be disposed on the substrate 100. The waveguide structure 300 may extend in the first direction D1 between the substrate 100 and the upper clad layer 200. According to an embodiment of the inventive concept, the waveguide 300 may have the same length in the first direction D1 as the substrate 100. That is, the waveguide structure 300 may extend from one end of the substrate 100 to the other end thereof. The waveguide structure 300 may be continuously provided on the gain region GR, the phase control region PR, and the tuning region DR. The waveguide structure 300 may provide a path of light in the laser device. To this end, the waveguide structure 300 may have a higher refractive index than the substrate 100 and the upper clad layer 200. The substrate 100 may function as a lower clad layer by having a lower refractive index than the waveguide structure 300.

The upper clad layer 200 may be disposed on the waveguide structure 300. The upper clad layer 200 may cover the upper surface of the waveguide structure 300. The upper clad layer 200 may include a compound semiconductor. The upper clad layer 200 may contain, for example, indium phosphide (InP). The upper clad layer 200 may be doped with a dopant of a second conductivity type which is different from the first conductivity type. The second conductivity type may be, for example, a p-type.

The lower electrode 410 may be disposed on the lower surface of the substrate 100, and the upper electrodes 510, 520, and 530 may be disposed on the upper surface of the upper clad layer 200. The substrate 100, the upper clad layer 200, and the waveguide structure 300 may constitute the laser diode LD described with reference to FIG. 1. The lower electrode 410 and a first upper electrode 510 among the upper electrodes 510, 520, and 530 may function as the cathode electrode or anode electrode of the laser diode LD.

Specifically, the substrate 100 may include a support layer 110 and the lower clad layer 120 on the support layer 110. The support layer 110 and the lower clad layer 120 may include indium phosphide (InP) doped with the dopant of the first conductivity type. For example, the lower clad layer 120 may be an upper portion of the substrate 100, which is not etched in an etching process for the substrate 100. According to embodiments of the inventive concept, the lower clad layer 120 may be an epitaxial layer partially disposed on the upper surface of the support layer 110. The support layer 110 and the lower clad layer 120 may extend side by side along the first direction D1. The support layer 110 and the lower clad layer 120 may have a certain width in a second direction D2 crossing the first direction D1. As illustrated in FIG. 3C, the width w3 of the lower clad layer 120 may be smaller than the width w4 of the support layer 110.

The substrate 100 may include an air gap AG therein. The air gap AG may be a space formed inside the substrate 100, and the space may be filled with gas. The air gap AG may be defined by the inner walls of the substrate 100. Hereinafter, terms such as width and length of the air gap AG are used, and the terms may substantially mean the distances between the inner walls of the substrate defining the air gap AG. The air gap AG may have a shorter length in the first direction D1 than the waveguide structure 300, and the air gap AG may have a larger width w1 than the width w2 of the waveguide structure 300.

The air gap AG may be located inside the phase control region PR and the tuning region DR. The air gap AG may extend, along the first direction D1, from the phase control region PR to the tuning region DR. The air gap AG may not be located inside the substrate 100 of the gain region GR. The air gap AG may increase the length of a current path between the lower electrode 410 and the upper electrodes 510, 520, and 530 in the phase control region PR and the tuning region DR. In other words, the air gap AG may reduce current movement in the phase control region PR and the tuning region DR when the gain region GR is driven. According to embodiments of the inventive concept, the air gap AG may be formed closer to the lower surface of the substrate 100 than the upper surface thereof. For example, the air gap AG may be located inside the support layer 110 of the substrate 100. Accordingly, the air gap AG may have a larger width w1 than the width w3 of the lower clad layer 120. The air gap AG may have a certain width w1 along the first direction D1, and the air gap AG may have a certain height in the third direction D3 along the first direction D1.

Grating patterns BG may be disposed inside the substrate 100 of the tuning region DR. The grating patterns BG may be disposed between the air gap AG and the upper surface of the substrate 100 inside the substrate 100. The grating patterns BG may be, for example, Bragg grating patterns. The grating patterns BG may contain a material different from that of the lower clad layer 120. The grating patterns BG may contain, for example, n-type InGaAsP. The grating patterns BG may be disposed inside the lower clad layer 120 of the substrate 100 and located adjacent to the waveguide structure 300. The grating patterns BG may satisfy the Bragg condition (mλ=2neqΛ, m: diffraction order (=1), λ: wavelength of light, neq: effective refractive index of waveguide layer, Λ: diffraction grating period). The wavelength λ of light may be determined by effective refractive indexes neq of the waveguide structure 300 and clad layers surrounding the waveguide structure 300.

The waveguide structure 300 may be located between the lower clad layer 120 and the upper clad layer 200. The waveguide structure 300 may be electrically connected to the lower clad layer 120 and the upper clad layer 200. The upper surface of the waveguide structure 300 may be in direct contact with the upper clad layer 200, and the lower surface of the waveguide structure 300 may be in direct contact with the lower clad layer 120. The waveguide structure 300 may include an active waveguide 310 and a passive waveguide 320. The active waveguide 310 may be provided on the gain region GR, and the passive waveguide 320 may be provided on the phase control region PR and the tuning region DR. The active waveguide 310 and the passive waveguide 320 may be combined with each other by a butt-coupling method. The active waveguide 310 may have a multiple quantum well (MQW) structure. The active waveguide 310 may contain a gain medium and launch light by receiving current from the lower electrode 410 and the upper electrodes 510, 520, and 530. The gain medium may contain a doped semiconductor material. For example, the gain medium may contain InGaAs or InGaAsP. Light launched from the active waveguide 310 may travel along the passive waveguide 320. The passive waveguide 330 may include an undoped semiconductor material. For example, the passive waveguide 330 may contain InGaAsP or InGaAs.

Side semiconductor patterns 150 may be disposed on the side surfaces of the waveguide structure 300. The side semiconductor patterns 150 may extend in the first direction D1 along the side surfaces of the waveguide structure 300, and the side semiconductor patterns 150 may be located between the upper clad layer 200 and the lower clad layer 120. According to an embodiment of the inventive concept, the side semiconductor patterns 150 may contain indium phosphide InP. The side semiconductor patterns 150 may function as a current blocking layer. Specifically, the side semiconductor patterns 150 may induce a current path so that the current between the upper clad layer 200 and the lower clad layer 120 may be concentrated in the waveguide structure 300. The side semiconductor patterns 150 may have a single-layer structure or a multilayer structure. For example, the side semiconductor patterns 150 may include a first layer having a conductivity type different from that of the substrate 100 and a second layer disposed on the first layer and having a conductivity type different from that of the clad layer 200. The side semiconductor patterns 150 together with the substrate 100 and the upper clad layer 200 may surround the waveguide structure 300. The side semiconductor patterns 150 may function as a clad layer together with the substrate 100 and the upper clad layer 200 by having a lower refractive index than the waveguide structure 300.

A lower electrode 410 may be disposed on the lower surface of the substrate 100. The lower electrode 410 may be electrically connected to the support layer 110 of the substrate 100. The lower electrode 410 may extend from the gain region GR to the tuning region DR via the phase control region PR. In other words, the lower electrode 410 may be a common electrode electrically connected to the substrate 100 of the gain region GR, the substrate 100 of the phase control region PR, and the substrate 100 of the tuning region DR. The lower electrode 410 may be in direct contact with the support layer 110 and completely cover the lower surface of the support layer 110. That is, the lower electrode 410 may have the same length in the first direction D1 as the substrate 100 and have the same width in the second direction D2 as the substrate 100.

The upper electrodes 510, 520, and 530 may be disposed on the upper surface of the upper clad layer 200. The upper electrodes 510, 520, and 530 may include a first upper electrode 510 of the gain region GR, a second upper electrode 520 of the phase control region PR, and a third upper electrode 530 of the tuning region DR.

Specifically, the first upper electrode 510 may be electrically connected to the upper clad layer 200 of the gain region GR. For example, the first upper electrode 510 and the upper clad layer 200 may be in ohmic contact. An interface layer 512 may be interposed between the first upper electrode 510 and the upper surface of the upper cladding layer 200. The interface layer 512 may contain metal. The interface layer 512 may be configured so that the first upper electrode 510 and the upper clad layer 200 have ohmic-contact characteristics, and may contain, for example, metal silicide.

A first pad 514 may be disposed on the first upper electrode 510. The first pad 514 may be electrically connected to the first upper electrode 510 and extend in the first direction D1 and the second direction D2. The first upper electrode 510 may be electrically connected, through the first pad 513, to one of the ports MOD+ and MOD− of the laser diode driver LDD described with reference to FIG. 1.

An insulating pillar 160 may be disposed between the first pad 514 and the support layer 110 of the substrate 100. The insulating pillar 160 may electrically insulate the first pad 514 and the substrate 100. The insulating pillar 160 may include a material having a small dielectric constant. For example, the dielectric constant of the insulating pillar 160 may be smaller than that of the cladding layers. Accordingly, the capacitance between the first pad 514 and the lower electrode 410 may be reduced, and high-speed modulation characteristics of the laser device may be improved. The insulating pillar 160 may contain, for example, benzocyclobutene and/or polyimide.

The second upper electrode 520 and the third upper electrode 530 may be electrically insulated from the upper clad layer 200. The second upper electrode 520 and the third upper electrode 530 may contain metal. The second upper electrode 520 and the third upper electrode 530 may have, for example, a mesh shape or a stripe shape. The second upper electrode 520 and the third upper electrode 530 may include, for example, a micro-heater.

According to embodiments of the inventive concept, the second upper electrode 520 and the third upper electrode 530 may have a two-terminal structure. That is, two second pads 522 and 524 may be disposed on the second upper electrode 520, and two third pads 532 and 534 may be disposed on the third upper electrode 530. The second pads 522 and 524 may be spaced apart from each other in the first direction D1. The third pads 532 and 534 may be spaced apart from each other in the first direction D1.

An upper insulating layer 540 may be disposed between the second upper electrode 520 and the upper cladding layer 200 and between the third upper electrode 530 and the upper clad layer 200. The upper insulating layer 540 may extend from the upper surface of the upper insulating layer 540 of the phase control region PR to the upper surface of the upper insulating layer 540 of the tuning region DR. The upper surface of the upper clad layer 200 of the upper insulating layer 540 may be partially covered. The upper insulating layer may contain, for example, silicon oxide ($SiO_2$) or silicon nitride ($SiN_x$). The upper insulating layer 540 electrically insulates the second upper electrode 520 and the third upper electrode 530 from the upper cladding layer 200, thereby reducing the noise of the laser device during differential-mode operation of the gain region GR.

Figure 4A:
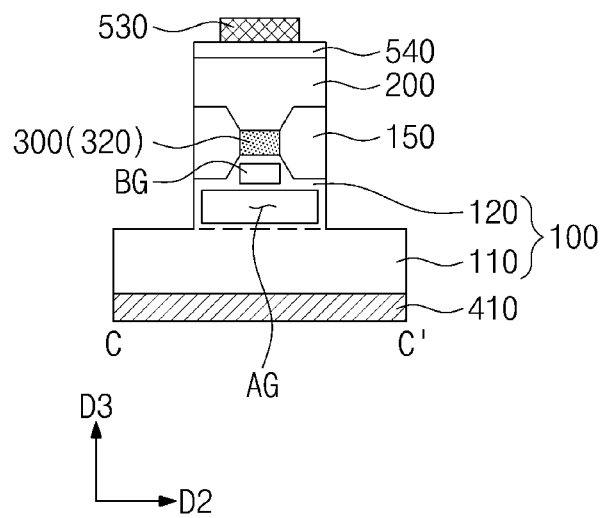
FIGS. 4A and 4B are cross-sectional views corresponding to line C-C' of FIG. 2 and describing a laser device according to embodiments of the inventive concept.
Figure 4B:
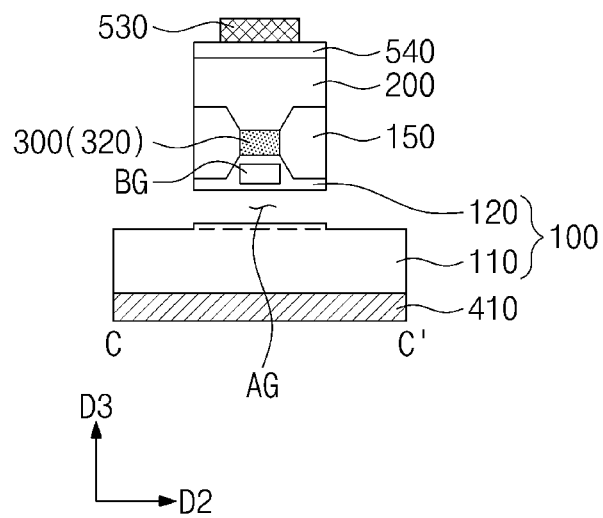

FIGS. 4A and 4B are cross-sectional views corresponding to line C-C' of FIG. 2 and describing a laser device according to embodiments of the inventive concept. For the purpose of brief description, detailed descriptions of the above-described and overlapping configurations may be omitted.

Referring to FIGS. 4A and 4B, unlike those described with reference to FIGS. 1 to 3C, the air gap AG may be formed inside the lower clad layer 120 of the substrate 100. The air gap AG may be formed closer to the upper surface of the substrate 100 than the lower surface of the substrate 100.

Referring to FIG. 4A, the air gap AG may be defined inside the lower clad layer 120. The air gap AG may be completely surrounded by the inner walls of the lower clad layer 120.

Referring to FIG. 4B, the air gap AG may penetrate the lower clad layer 120 in the second direction D2. Although not illustrated, the upper surface of the lower clad layer 120 positioned above the air gap AG may be supported by the sidewalls (see FIG. 2) of the lower clad layer 120 facing in the first direction D1.

Figure 5:
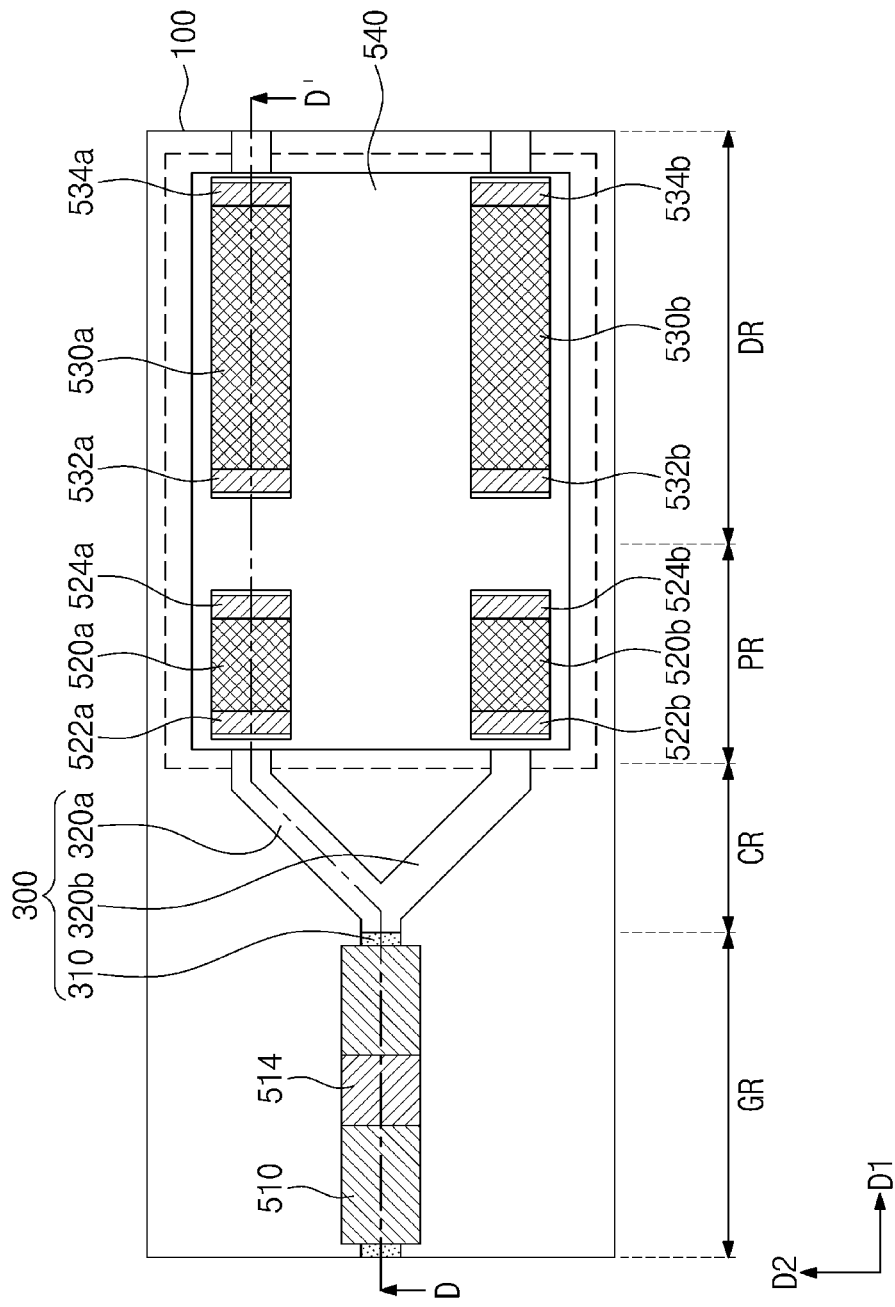
FIG. 5 is a plan view illustrating a laser device according to embodiments of the inventive concept.
Figure 6:
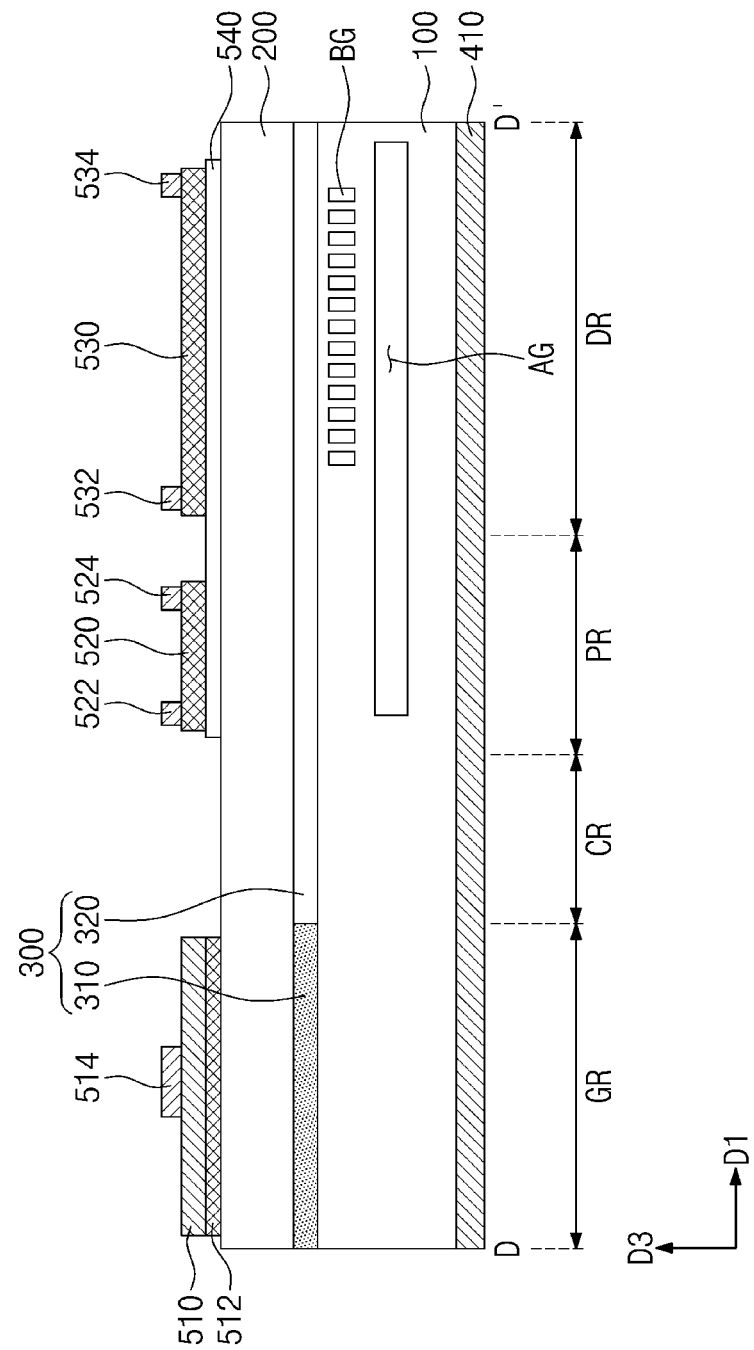
FIG. 6 is a cross-sectional view, which is taken along line D-D' of FIG. 5, to illustrate a laser device according to embodiments of the inventive concept.

FIG. 5 is a plan view illustrating a laser device according to embodiments of the inventive concept. FIG. 6 is a cross-sectional view, which is taken along line D-D' of FIG. 5, to illustrate a laser device according to embodiments of the inventive concept. For the purpose of brief description, detailed descriptions of the above-described and overlapping configurations may be omitted.

Referring to FIGS. 5 and 6, the laser device may have a plurality of output terminals. The substrate 100 may include a branch region CR between the gain region GR and the phase control region PR. On the substrate 100 of the branch region CR, the passive waveguides 320a and 320b of the waveguide structure 300 may be branched into the first passive waveguide 320a and the second passive waveguide 320b. Each of the first passive waveguide 320a and the second passive waveguide 320b may extend from the branch region CR to the tuning region DR via the phase control region PR. On the phase control region PR and the tuning region DR, the first passive waveguide 320a and the second passive waveguide 320b may be spaced apart from each other in the second direction (D2).

Second upper electrodes 520a and 520b and third upper electrodes 530a and 530b may be disposed on the first passive waveguide 320a and the second passive waveguide 320b. The second upper electrodes 520a and 520b may be disposed on the upper clad layer 200 of the phase control region PR, and the third upper electrodes 530a and 530b may be disposed on the upper clad layer 200 of the tuning region DR. The second upper electrodes 520a and 520b may be spaced apart from each other on the phase control region PR in the second direction D2. The third upper electrodes 530a and 530b may be spaced apart from each other on the tuning region DR in the second direction D2. Second pads 522a, 524a, 522b, and 524b spaced apart from each other in the first direction D1 may be disposed on the second upper electrodes 520a and 520b. Third pads 532a, 534a, 532b, and 534b spaced apart from each other in the first direction D1 may be disposed on the third upper electrodes 530a and 530b.

The upper insulating layer 540 may be disposed on the upper clad layer 200 of the phase control region PR and the tuning region DR. The upper insulating layer 540 may be disposed between the second upper electrodes 520a and 520b and the upper clad layer 200 and between the third upper electrodes 530a and 530b and the upper clad layer 200. The upper insulating layer 540 electrically insulates the second upper electrodes 520a and 520b and the third upper electrodes 530a and 530b from the upper cladding layer 200, thereby reducing the noise of the laser device during differential-mode operation of the gain region GR.

Figure 7:
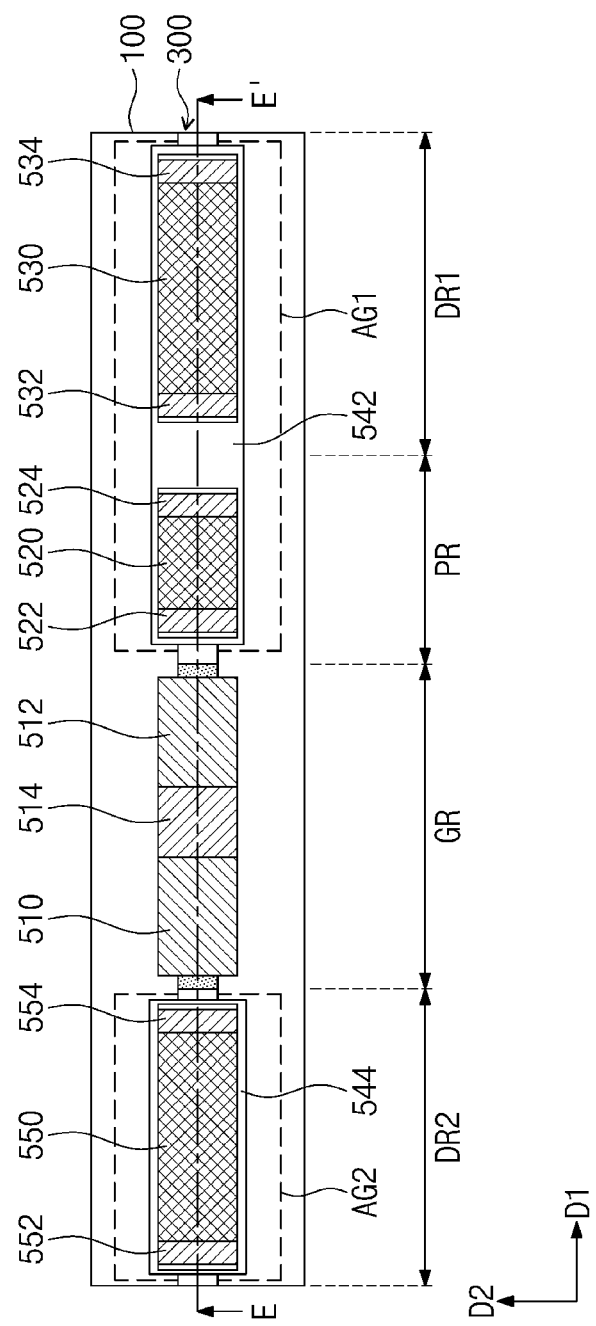
FIG. 7 is a plan view illustrating a laser device according to embodiments of the inventive concept.
Figure 8:
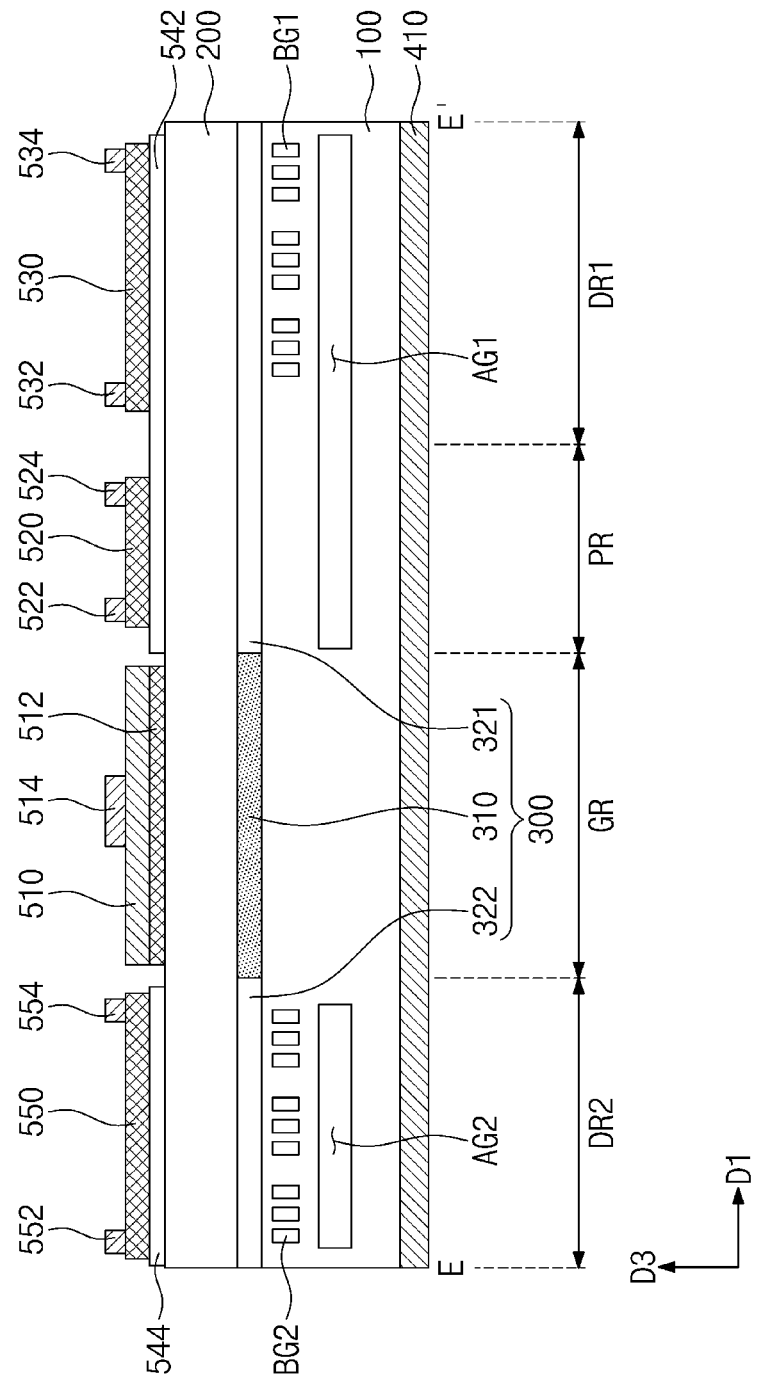
FIG. 8 is a cross-sectional view, which is taken along line E-E' of FIG. 7, to illustrate a laser device according to embodiments of the inventive concept.

FIG. 7 is a plan view illustrating a laser device according to embodiments of the inventive concept. FIG. 8 is a cross-sectional view, which is taken along line E-E' of FIG. 7, to illustrate a laser device according to embodiments of the inventive concept. For the purpose of brief description, detailed descriptions of the above-described and overlapping configurations may be omitted.

Referring to FIG. 7, the substrate 100 may further include a second tuning region DR2 at one side of the gain region GR. The second tuning region DR2 may be spaced apart from the phase control region PR in the first direction D1 with the gain region GR interposed therebetween.

A fourth electrode 550 may be disposed on the upper clad layer 200 of the second tuning region DR2. The fourth electrode 550 may be electrically insulated from the upper clad layer 200. The fourth electrode 550 may contain the same material as the third electrode 530. Fourth pads 552 and 554 may be disposed on the fourth electrode 550. The fourth pads 552 and 554 may be spaced apart from each other in the first direction D1. A first upper insulating layer 542 may be disposed between the second upper electrode 520 and the upper clad layer 200 and between the third upper electrode 530 and the upper clad layer 200. A second upper insulating layer 544 may be disposed between the fourth electrode 550 and the upper clad layer 200.

The lower electrode 410 may extend from the second tuning region DR2 to the first tuning region DR1 via the gain region GR and the phase control region PR. The lower electrode 410 may be a common electrode electrically connected to the second tuning region DR2, the gain region GR, the phase control region PR, and the first tuning region DR1 of the substrate 100.

The waveguide structure 300 may include a first passive waveguide 320a, an active waveguide 310, and a second passive waveguide 320b. The first passive waveguide 320a may be connected to one end of the active waveguide 310, and the second passive waveguide 320b may be connected to the other end thereof. The active waveguide 310 may be butt-coupled to the first passive waveguide 320a and the second passive waveguide 320b.

A first air gap AG1 may be formed inside the substrate 100 of the phase control region PR and the first tuning region DR1. The first air gap AG1 may extend from the phase control region PR to the tuning region DR. A second air gap AG2 may be formed inside the substrate of the second tuning region DR2. The second air gap AG2 may be positioned at the same vertical level as the first air gap AG1, and may have a length in the first direction D1 shorter than the first air gap AG1. The first air gap AG1 and the second air gap AG2 may reduce the noise of the laser device during differential-mode operation of the gain region GR.

A first grating pattern BG1 may be disposed between the first air gap AG1 and the substrate 100, and a second grating pattern BG2 may be disposed between the second air gap AG2 and the substrate 100. The grating pattern BG1 may be disposed inside the substrate 100 of the first tuning region DR1, and the second grating pattern BG2 may be disposed inside the substrate 100 of the second tuning region DR2. According to embodiments of the inventive concept, the first grating pattern BG1 and the second grating pattern BG2 may have different grating periods.

According to embodiments of the inventive concept, differential-mode operation of a gain region is possible, a phase modulator and a wavelength variable unit may be independently controlled, and a laser device having an excellent signal-to-noise ratio may be provided In the above, embodiments of the inventive concept have been described with reference to the accompanying drawings, but the inventive concept may be implemented in other specific forms without changing the technical spirit or essential features thereof. Therefore, it should be understood that the embodiments described above are illustrative in all respects and not limiting the inventive concept.

Although the exemplary embodiments of the inventive concept have been described, it is understood that the present invention should not be limited to these exemplary embodiments but various changes and modifications can be made by those of ordinary skill in the art within the spirit and scope of the present invention as hereinafter claimed.

What is claimed is:

1. A laser device comprising:
a substrate comprising a gain region, a phase control region, and a tuning region arranged along a first direction, the substrate having an air gap which extends from the phase control region to the tuning region;
an upper clad layer on the substrate;
a waveguide structure extending in the first direction between the upper clad layer and the substrate;
a first upper electrode disposed on the upper surface of the upper clad layer of the gain region; and
a lower electrode disposed on the lower surface of the substrate and extending from the gain region to the tuning region,
wherein the air gap has a larger width than the waveguide in a second direction crossing the first direction,
the substrate comprises a support layer and a lower clad layer disposed on the support layer,
the lower clad layer has a width, in the second direction, which is smaller than that of the support laver, and
the air gap is located at a lower level than the lower clad layer.

2. The laser device of claim 1, further comprising grating patterns in the substrate of the tuning region, the grating patterns disposed between the air gap and the upper surface of the substrate.

3. The laser device of claim 1, wherein the width of the air gap in the second direction is greater than that of the lower clad layer in the second direction.

4. The laser device of claim 1, wherein the air gap has a width smaller than the maximum width of the substrate in the second direction.

5. The laser device of claim 1, further comprising:
a second upper electrode on the upper clad layer of the phase control region;
a third upper electrode on the upper clad layer of the tuning region; and
an upper insulating layer between the second and third upper electrodes and the upper cladding layer.

6. The laser device of claim 1, further comprising:
a second upper electrode on the upper clad layer of the phase control region; and
a plurality of pads connected to the second upper electrode.

7. The laser device of claim 1, wherein the waveguide structure further comprises: an active waveguide on the gain region; and a passive waveguide connected to the active waveguide and on the phase control region and the tuning region.

8. The laser device of claim 1, further comprising side semiconductor patterns disposed on a side surface of the waveguide structure.

9. The laser device of claim 1, wherein the upper clad layer has a conductivity type which is different from that of the substrate.

10. A laser device comprising:
a substrate comprising a gain region, a tuning region, and a phase control region between the gain region and the tuning region, the substrate having an air gap which extends from the phase control region to the tuning region;
a lower electrode disposed on a lower surface of the substrate and extending from the gain region to the tuning region;
an upper clad layer on the upper surface of the substrate;
a waveguide structure between the substrate and the upper cladding layer;
a first upper electrode disposed on the upper cladding layer of the gain region and electrically connected to the upper cladding layer;
a second upper electrode disposed on the upper clad layer of the phase control region and electrically insulated from the upper clad layer; and
a third upper electrode disposed on the upper clad layer of the tuning region and electrically insulated from the upper clad layer,
wherein the substrate comprises: a support laver; and a lower clad layer having a width which is smaller than that of the support layer, wherein the air gap is located at a lower level than the lower clad layer.

11. The laser device of claim 10, wherein the lower electrode is electrically connected to the gain region, the phase control region, and the tuning region of the substrate.

12. The laser device of claim 10, wherein the upper clad layer has a conductivity type which is different from that of the substrate.

13. The laser device of claim 10, further comprising:
a first pad on the first upper electrode; and
an insulating pillar between the first pad and the substrate, wherein the insulating pillar has a lower permittivity than the substrate.

14. The laser device of claim 10, further comprising:
second pads on the second upper electrode; and
third pads on the third upper electrode.

* * * * *